United States Patent
Shakuda et al.

[19]

[11] Patent Number: 6,107,644
[45] Date of Patent: Aug. 22, 2000

[54] SEMICONDUCTOR LIGHT EMITTING DEVICE

[75] Inventors: Yukio Shakuda; Shunji Nakata; Masayuki Sonobe; Tsuyoshi Tsutsui; Norikazu Itoh, all of Kyoto, Japan

[73] Assignee: Rohm Co., Ltd., Kyoto, Japan

[21] Appl. No.: 09/012,209

[22] Filed: Jan. 23, 1998

[30] Foreign Application Priority Data

Jan. 24, 1997 [JP] Japan ................................. 9-011221
Jan. 24, 1997 [JP] Japan ................................. 9-011222
Jan. 24, 1997 [JP] Japan ................................. 9-011223
Jan. 24, 1997 [JP] Japan ................................. 9-011226
Jan. 24, 1997 [JP] Japan ................................. 9-011227
Jan. 24, 1997 [JP] Japan ................................. 9-011228

[51] Int. Cl.$^7$ ................................................ H01L 27/15
[52] U.S. Cl. ............................. 257/79; 257/99; 257/773
[58] Field of Search .......................... 257/79, 99, 773

[56] References Cited

U.S. PATENT DOCUMENTS 5,563,422  10/1996  Nakamura et al. ........................ 257/79

*Primary Examiner*—Mark V. Prenty
*Attorney, Agent, or Firm*—Arent Fox Kininer Ploikin & Kahn PLLC

[57] ABSTRACT

A semiconductor light emitting device has semiconductor layers including a first conductivity type semiconductor layer and a second conductivity type semiconductor layer formed on a substrate. A first electrode is formed in electrical connection with the first conductivity type semiconductor layer on a surface side of the semiconductor layers. The second conductivity type semiconductor layer is exposed by partly etch-removing an end portion of the semiconductor layers. A second electrode is provided in electrical connection with the exposed second conductivity type layer. The first and second electrodes are formed such that the electrodes are in parallel, in plan form, with each other at opposite portions thereof. As a result, the current path is constant in electric resistance, providing a semiconductor light emitting device that is constant in brightness, long in service life and high in brightness.

10 Claims, 7 Drawing Sheets

SEMICONDUCTOR LIGHT EMITTING DEVICE

BACKGROUND OF THE INVENTION

This invention relates to semiconductor light emitting devices utilizing a gallium-nitride based compound semiconductor adapted for emitting bluish light (from ultraviolet ray to yellow light). More particularly, this invention relates to an improvement in efficiency of outwardly radiating light as well as uniformity of light emission in a light emitting chip for a semiconductor light emitting device which has, on a substrate, semiconductor layers having electrodes respectively formed on a first conductivity-type semiconductor layer on a surface side and on a second conductivity-type semiconductor layer exposed by etching part of the semiconductor layers.

The semiconductor light emitting device for emitting bluish light is structured, for example, by an sapphire insulating substrate and gallium-nitride based compound semiconductor layers formed thereon, as shown in schematic exemplary view in FIG. 10(a). That is, the semiconductor layers includes, for example, an n-type layer (cladding layer) 23 of an n-type GaN epitaxially grown on the sapphire substrate 21, an active layer 24 formed of a material having a bandgap energy lower than that of the cladding layer such as an InGaN-based (having In and Ga variable in ratio thereof) compound semiconductor, and a p-type layer (cladding layer) 25 formed of a p-type GaN. A p-side electrode 28 is provided on a surface of the semiconductor layers, while an n-side electrode 29 is provided on a surface of the n-type layer 23 exposed by etching part of the semiconductor layers. Thus, an LED chip is constituted.

When a forward voltage is applied between the p-side electrode 28 and the n-side electrode 29 of the LED chip thus structured, an electric current flows from the p-side electrode 28 spreading through the p-type layer 25 into the active layer 24, so that it further flows by way of the n-side layer 23 into the n-side electrode 29. In the active layer 24 of the course of the current path, recombination of carriers occur to thereby cause light emission. Incidentally, a current diffusion layer, not shown, of an Ni—Au alloy or the like may be provided on the surface of the p-type layer 25 in order to cause spreading of the electric current throughout the entire p-type layer 25.

Meanwhile, the p-side electrode 28 and the n-side electrode 29 in general are formed in a circular or rectangular shape in plan, as shown in FIGS. 10(b) to 10(c). Accordingly, the p-side electrode 28 and the p-side electrode 29, at their outer peripheries, are distant away from each other so that the electric current path, as viewed in plan, is different in distance from the p-side electrode 28 to the n-side electrode 29 depending upon a location considered, as demonstrated by A and B in the figure.

Moreover, where an current diffusion layer as stated is provided, the current diffusion layer is comparatively low in electric resistance so that the current is liable to readily spread throughout the current diffusion layer. However, an etched form providing the n-side electrode 29 is different from the shape of the n-side electrode 29. As shown in plan views of FIGS. 10(b) to 10(c) (the current diffusion layer is not shown but will be similar in shape to the p-type layer 25), the distance in plan between the current diffusion layer and the n-side electrode 29, in many cases, is differrent as shown by C and D.

If there is difference in distance between the respective electrodes or between the current diffusion layer and an electrode depending upon the current path as stated above, then the electric resistance increases in certain regions where the distance thereof is long. In particular, the gallium-nitride based compound semiconductor, if employed for forming the semiconductor layers, is high in electric resistance as compared to a GaAs-based compound semiconductor so that it is prominent in increase of series resistance in distance considered becomes long. Although the increase in electric resistance for the gallium-nitride based compound semiconductor is prominent for the p-type layer where the dopant is not sufficiently introduced, the n-type layer also has a high resistance increase as compared to the GaAs based compound semiconductor. To this end, if the p-side electrode 28 and the n-side electrode have a low series resistance in a certain plane within the LED chip, i.e. a short distance at their opposite portions, the current flow concentrates there and the active layer of the LED chip has its electric current unevenly flowing therethrough, resulting in uneven light emission.

Furthermore, where providing a current diffusion layer through which the light is radiated, the electric resistance of the current diffusion layer cannot be reduced to a sufficient extent when the light is to be transmitted therethrough. Conversely, if the electric resistance of the same layer is to be lowered, the light is shielded resulting in lowering in the light radiating efficiency, i.e. the rate of the light that can be radiated outward of the device. On the other hand, it is impossible to increase the area of the p-side electrode 28 to a sufficient extent because the p-side electrode 28 shields the light completely. Meanwhile, light emission is done by carrier recombination within the active layer as stated before, so that it is preferred that the electric current flows spreading through the active layer as broad as possible at its plane. To this end, there is a problem that the current diffusion layer 27 and the electrodes 28, 29 have to be formed in a manner satisfying reciprocal functions of light shield and current diffusion.

SUMMARY OF THE INVENTION

It is therefore a primary object of the present invention to provide a semiconductor light emitting device which is capable of flowing electric currents uniformly distributed in a plane within a chip thereof even where semiconductor layers of the device are formed by using a gallium-nitride based compound semiconductor comparatively high in electric resistance.

It is another object of the present invention to provide a semiconductor light emitting device that is improved in light emission efficiency for outwardly radiating light by reducing light shield effects due to an electrode while attempting uniform distribution of electric currents within a chip.

It is a further object of the present invention to provide a semiconductor light emitting device which has a pair of electrodes (pads) provided close to one side of a substrate so that, when wire-bonding is made to the electrodes by an automatic machine, bonding operation is efficiently made with easy inputting of data without inefficient movement in the automatic machine.

According to the present invention, a semiconductor light emitting device comprises: a substrate in a quadrilateral form; semiconductor layers formed of a gallium-nitride based compound semiconductor on the substrate to include a first conductivity type semiconductor layer and a second conductivity type semiconductor layer; a first electrode formed in electrical connection with the first conductivity type semiconductor layer provided on a surface side of the semiconductor layers; a second electrode formed in electrical connection with the second conductivity type semiconductor layer exposed by partly etch-removing an end portion in plan of the semiconductor layers; and wherein the first and second electrodes are formed such that the electrodes are in parallel, in plan form, with each other at opposite portions thereof.

Here, the "first conductivity type" and the "second conductivity type" means that when either one of the polarities for a semiconductor, i.e. p-type and n-type, is taken as a first conductive type, the other polarity is considered as a second conductivity type.

With this structure, the distance between the p-side electrode and the n-side electrode is constant at their opposite portions, regardless of the position on the opposite portions. The current path and hence the electric resistance between these electrodes is not varied by the position, thereby offering even light emission within a radiating plane.

It is preferred that an end form of the first conductivity type semiconductor layer left unetched in the etching and the second electrode are formed in parallel, in plan form, with each other at opposite portions thereof. With this structure, the distance from the second conductivity type semiconductor layer, at immediately beneath the etched end of the first conductivity type layer, to the second electrode is the same at every position. Consequently, the electric current, that is spread in the first conductivity type semiconductor layer and flowing into the second conductivity type semiconductor layer, flows spreading throughout the second conductivity type semiconductor layer without concentration at a particular location.

A current diffusion layer is preferably provided in the semiconductor layers at surface side thereof. This structure serves to facilitate current diffusion into the first conductivity type semiconductor layers.

The device may be constituted by that at least the first electrode is formed at substantially an entire surface of the semiconductor layer thereof on which the electrode is provided. This structure enables the electric current to uniformly flow through an entire surface of the LED chip, contributing to enhancing light emitting efficiency.

Here, the "substantially an entire surface" means to provide (an electrode) over a broard area in the surface of the semiconductor layers to cause spread in electric current flow to a sufficient extent, involving also the case that the electrode is formed not completely covering end portions of the same surface in order to prevent against shorting due to electrode edge dropping to an lateral surface of the semiconductor layers.

The substrate is preferably formed in a rectangular form in plan, and the first and second electrodes being separately provided in a lengthwise direction of the rectangular form. This structure provides separation between the first and second electrodes so that, when the light emitting chip is die-bonded face-down onto leads or a circuit board with the electrodes independently connected thereto, there is no fear of short-circuiting between the first and second electrodes.

The substrate is preferably a sapphire substrate, and the semiconductor layers are preferably of a gallium-nitride based compound semiconductor. This structure provides greater effects because the electric resistance tends to increase through the semiconductor layers.

Here, the "gallium-nitride based compound semiconductor" refers to a semiconductor comprising a compound having a group-III element Ga and a group-V element N, wherein part of the group-III element Ga may be substituted by other group-III elements such as Al and In and/or part of the group-V element N may be substituted by other group-V elements such as P and As.

According to another form of the present invention, a semiconductor light emitting device comprises: a substrate in a quadrilateral form; semiconductor layers formed of a gallium-nitride based compound semiconductor on the substrate to include a first conductivity type semiconductor layer and a second conductivity type semiconductor layer; a current diffusion layer provided in the semiconductor layer on a surface side thereof; a first electrode formed on a surface of the current diffusion layer to have electrical connection with the first conductivity type semiconductor layer; a second electrode formed in electrical connection with the second conductivity type semiconductor layer exposed by partly etch-removing an end portion in plan of the semiconductor layers; and wherein the current diffusion layer left unetched in the etching and the second electrode are formed to have an equi-distance given therebetween, in plan form, at opposite portions thereof, and at least the first electrode of the electrodes having voids formed therethrogh.

This structure is preferred because it is possible to reduce the light shield due to the presence of the electrode.

Here, the provision of the "voids" means that the electrode metal is formed in an intermittent manner, such as a mesh form, a grating form, a ring form or a polka form, in the electrode plane, instead of continuous form over the entire electrode-bonding portion.

The first and second electrodes are preferably both placed along one side in a plan form of the substrate. This structure provides conveniences for automatic wire-bonding using an automatic machine.

Here, the "electrodes" means electrode portions (electrode pads) formed thick for enabling wire-bonding thereto, and include, where one of the electrodes is formed wide, part of the one electrode is arranged, together with the other electrode, along the one side.

In further form of the present invention, a semiconductor light emitting device comprising: a substrate; semiconductor layers formed on the substrate to include a first conductivity type semiconductor layer and a second conductivity type semiconductor layer; a first electrode formed in electrical connection with the first conductivity type semiconductor layer of the semiconductor layers; a second electrode formed in electrical connection with the second conductivity type semiconductor layer of the semiconductor layers; and wherein the first electrode has voids formed therethrough so that light is radiated through a surface on which the first electrode is provided. With this structure, the electrode has a number of openings so that the electrode has exposed portions on which no wire-bonding is made that can transmit the light emitted by the semiconductor layer located therebeneath.

In still further form of the present invention, a semiconductor light emitting device comprising: a substrate; semiconductor layers formed of a gallium-nitride based compound semiconductor on the substrate; a first electrode formed in electrical connection with the first conductivity type semiconductor layer in the semiconductor layers on a surface side thereof; a second electrode formed in electrical connection with the second conductivity type semiconductor layer exposed by partly etch-removing an end portion in plan of the semiconductor layers; and wherein both the first and second electrodes are provided along one side in plan form of the substrate.

With this structure, if the LED chip is die-bonded such that the one side close to the electrodes thereof is perpendicular to an interconnection on a circuit board, the both electrodes are same in x-coordinate provided that the direction of the interconnection is taken as an x axis. Therefore, it is satisfactory to input only y-coordinate values because the x-coordinate value is constant. This eliminates input errors and twice movements in the x-direction in the automatic machine.

In another form of the present invention, a semiconductor light emitting device comprising: a substrate transmissible of the light emitted by a light emitting layer; semiconductor layers formed on the substrate to include a first conductivity type layer and a second conductivity type layer to form the light emitting layer; a first electrode formed in connection with the first conductivity type semiconductor layer in the semiconductor layers on a surface side thereof; a second electrode formed in connection with the second conductivity type semiconductor layer exposed by partly etch-removing the semiconductor layers; and wherein at least the first electrode is formed at substantially an entire surface of the semiconductor layer on which the electrode is provided.

With this structure, the device can be die-bonded, at the surface on which the first and second electrode are provided, onto leads or a circuit board so that light is utilized through transmitting through the backside of the substrate. Consequently, low electric resistance of electrodes can be provided substantially over the entire surface of the semiconductor layers without the necessity of providing a current diffusion layer, thereby providing sufficient current diffusion. Furthermore, the absence of electrodes on the light radiating surface (backside of the substrate) poses no problems of shield or attenuation of light due to a current diffusion layer or an electrode.

For a fuller understanding of the nature and advantages of the invention, reference should be made to the ensuing detailed description taken in conjunction with the accompanying drawings.

DETAILED DESCRIPTION

Figure 1:
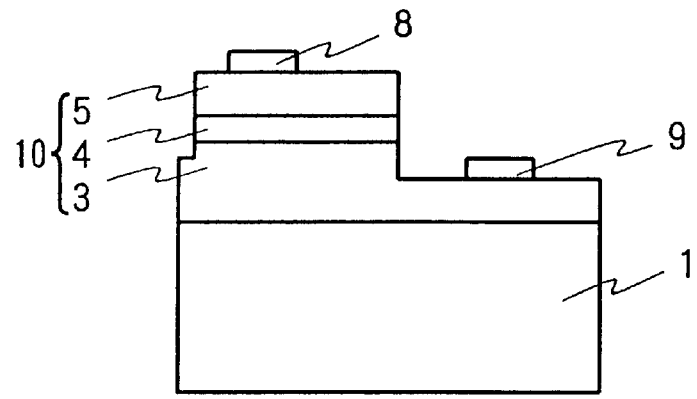
FIGS. 1(a) and 1(b) are sectional and plan explanatory views of a semiconductor light emitting device according to one embodiment of the present invention.
Figure 1:
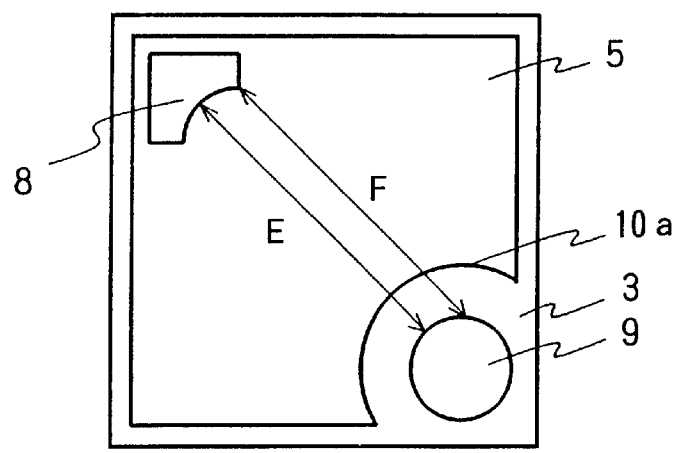

Referring to FIGS. 1(a) and 1(b), there is illustrated a semiconductor light emitting device according to one embodiment of the present invention. The semiconductor light emitting device includes a rectangular-form substrate 1 of sapphire ($Al_2O_3$ single crystal) or the like on which semiconductor layers 10 are formed. The semiconductor layer 10 has, on a top side, a first conductivity type semiconductor layer (p-type layer 5) electrically connected with a p-side electrode (first electrode) 8 through a current diffusion layer 7. The semiconductor light emitting device, in a chip form, has also a second conductivity type semiconductor layer (n-type layer 3) exposed by removing part of the semiconductor layers 10 to have thereon an n-side electrode (second electrode) 9 in electrical connection therewith. The present invention is characterized, as shown in FIG. 1(b), by arranging the p-side and n-side electrodes 8, 9 such that the electrodes 8, 9 have their opposite portions or faces parallel with each other, as viewed in plan. As a result, the distance between the p-side electrode 8 and the n-side electrode 9 is equal (E=F) at any opposite portion thereof.

The p-side electrode 8 and the n-side electrode scan be formed into a desired shape by film-forming, through evaporating, electrode metals and then patterning the evaporated metals with using photoresist, or otherwise by a lift-off technique wherein a photoresist layer is previously formed to be patterned to evaporate thereon electrode metals. Thus, the respective electrodes 8, 9 are provided in parallel with each other at their opposite portions, as shown in FIG. 1(b).

In the embodiment shown in FIG. 1(b), the semiconductor layers 10 are partly etched away so as to leave an exposed surface with an etched end 10a so that an n-side electrode 9 is provided thereon also in parallel, in plan, with the etched end 10a at their opposite portions. This results in equal distance between the n-side electrode 9 and the etched end 10a close thereto at any portion thereof. In also this case, the above-stated form is easily available with a desired shape through mask patterning similar to the above patterning for the electrodes.

The semiconductor layers 10 are provided on the substrate 1 by forming, in order, a low temperature buffer layer, an n-type layer 3 formed by an overlying structure of n-type GaN and/or AlGaN-based (having a variable ratio of Al and Ga) compound semiconductor sublayers for providing a cladding layer, an active layer 4 formed of a material having a bandgap energy lower than that of the cladding layer, e.g. an InGaN-based compound semiconductor, and a p-type layer (cladding layer) 5 formed by a p-type AlGaN-based compound semiconductor layer and/or a GaN layer.

To manufacture a semiconductor light emitting device structured as above, a substrate is placed within a reactor. Introducing reacting gases and required dopant gases into the reactor, an n-type layer 3 with a layer thickness of approximately 1–5 $\mu$m, an active layer 4 with a layer thickness of approximately 0.05–0.3 $\mu$m, and a p-type layer 5 with a layer thickness of approximately 0.2–1 $\mu$m are formed, in the order, by epitaxial growing on the substrate through a metal-organic chemical vapor deposition (MOCVD) method. Thereafter, a photoresist layer is formed on a surface of the substrate thus processed and patterned so that part of overlaid semiconductor layers are removed by reactive ion etching using a chlorine gas or the like, as shown in FIG. 1. In order to give equi-distance at opposite portions between the etched end 10a and the n-side electrode 9 as shown in FIG. 1, the photoresist layer pattern is formed to provide mask form to etch the semiconductor layers to have an etch end form parallel with (similar to) the opposite n-side electrode 9. Thereafter, a p-side electrode 8 is formed, through a lift-off method, by forming Ti and Au metal layers. Similarly, an n-side electrode 9 is formed, through the lift-off method, by forming Ti and Al layers to be sintered into an alloy of these metals. When forming these p-side electrode 8 and the n-side electrode 9, a mask is patterned to provide a parallel form, in plan, between opposite portions of these electrodes, as stated before. As a result, a semiconductor light emitting device as shown in FIG. 1 is obtained.

In the semiconductor light emitting device of this embodiment, an electric current supplied from the p-side electrode 8 passes through the p-type layer 5, the active layer 4, and the n-type-layer 3, to the n-side electrode 9. The current passage usually is through a path of a low electric resistance. However, the p-side electrode 8 and the n-side electrode 9 have an equi-distance and hence electric resistance therebetween at their opposite portions, providing even spread for the current. However, although a distant corner of the electrode has a longer distance as compared to the closer portion thereof so that it has a greater electric resistance and hence a decreased current, the same electrode has a same shape on opposite side so that the reduction in brightness is in a same extent to have negligible imbalance therebetween and free from current concentration due to reduced resistance. Consequently, the light emission is uniform throughout the entire surface of the LED chip without deterioration in the semiconductor layers due to partial concentration of current and hence partial unevenness in brightness.

The etch end 10a left on the remaining semiconductor layers 10 and the n-side electrode 9 are provided in parallel (equi-distant), in plan, at their opposite portions. Consequently, although the current flows through the path that spreads in the p-type layer to reach the type layer leading to the n-side electrode 9, the distance from the etched end 10a to the n-side electrode 9 is the same if taking any point of the etched end 10a. Accordingly the current path from the p-side electrode 8 to the n-side electrode 9 has the same electric resistance through the underneath of the etched end 10a of the n-type layer 3 leading to the n-side electrode 9, regardless of the current path at underneath the etched end 10a. This enable the current path, leading from the p-type layer 5 through the active layer 4 to the n-type layer, to spread in the n-type layer 3 without concentration at part thereof. To this end, the active layer 4 has appropriately distributed electric currents passing therethrough so that light emission is evenly made at the entire surface of the LED chip without deviation in intensity. The parallel form at the opposite portions between the etched end 10a and the n-side electrode 9 provides greater effects due to well current spreading through the p-type layer, where a current diffusion layer is provided as stated later.

Figure 2:
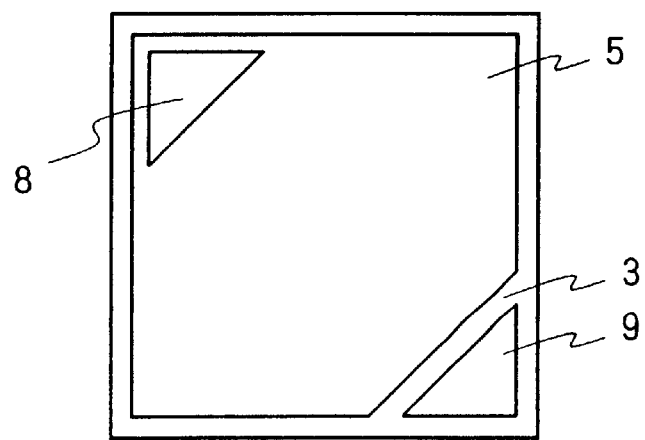
FIG. 2 is a plan explanatory view of a modification to the embodiment of FIG. 1.

This embodiment has the p-side electrode 8 and the n-side electrode 9 formed such that their opposite portions have an equi-distance given therebetween as stated above, and not limited to the shape in the opposite portions. That is, the electrodes may have straight-lined opposite portions that are parallel with each other, as shown in FIG. 2. The shape may be a curved surface other than the above-stated arcuate or circular, provided that the opposite portions are in parallel with each other to have an equi-distance. Incidentally, in FIG. 2 the same parts were denoted by the same reference character.

Although in the embodiment of FIG. 1 the p-side electrode 8 is provided directly on the p-type layer 5, the p-side electrode 8 may be provided through a current diffusion layer (not shown). With such a structure, the effects are similarly available provided that the p-side electrode 8 and n-side electrode 9 are in parallel at their opposite portions. The current diffusion layer is formed by forming, for example, Ni and Au layers through vacuum evaporation and sintering for alloying to a thickness of approximately 2–100 nm. The current diffusion layer has to be formed to transmit the light emitted by the active layer 4. In the meanwhile, the light transmission and the electric resistance are in a reciprocal relation as stated before so that it is impossible to reduce the electric resistance to a negligible extent (if the current diffusion layer is increased in thickness in order to reduce the electric resistance, the light becomes difficult to transmit). However, the provision of a current diffusion later provides for current diffusion through the p-type layer due to a certain degree of current diffusion through the current diffusion layer. In this case, the concentration of current in the n-type layer 3 is further prevented by the etching of the semiconductor layers 10 in a manner of giving a equi-distance between the p-type layer etched end 10a and the n-side electrode 9.

Figure 3:
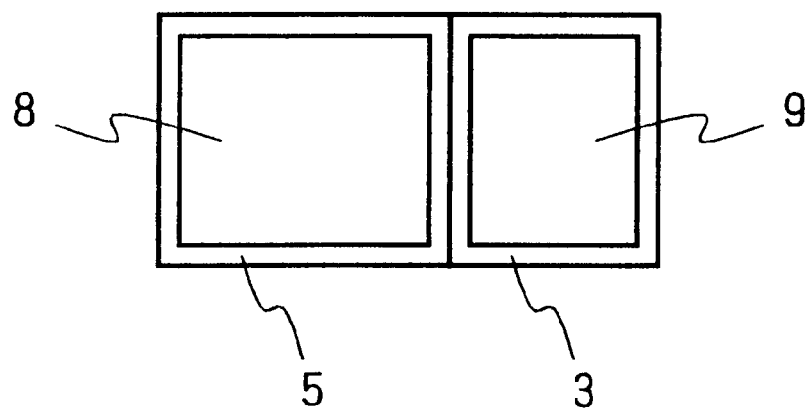
FIG. 3 is a plan explanatory view of a semiconductor light emitting device according to another embodiment of the present invention.

Referring to FIG. 3, there is shown a plan view of an example having respective electrodes that are almost entirely formed on a p-type layer and an exposed n-type layer 3. As stated above, electrode metals in general will not transmit light so that there is particle requirement that the electrodes, if provided on a light radiating surface, have to be formed as small as possible. However, where a semiconductor light emitting device, such as a bluish-light semiconductor light emitting device, is formed by a sapphire substrate ($Al_2O_3$ single crystal) and the overlying gallium-nitride based compound semiconductor layers, the electrodes can be provided over almost entire surface of the semiconductor layer, as shown in this example, so that the light is radiated outward at a backside surface of the transparent substrate.

Although the semiconductor layer overlying structure is similar to the afore-said embodiment and explanation thereof is omitted here, this example has a substrate 1 that is transmissible of the light emitted by its active layer 4 and both p-side electrode 8 and n-side electrode 9 are provided on a side of the semiconductor layers formed on the substrate. Further, the overlying semiconductor layers have the p-side electrode 8 directly formed on the surface thereof without providing a current diffusion layer. The p-side electrode 8 and the n-side electrode 9 are formed over almost (substantially) the entire surface of the semiconductor layers connected therewith.

Since the p-side electrode 8 is formed directly on the surface of the semiconductor layers without providing a current diffusion layer therebetween, there is a necessity of giving ohmic contact between the p-type electrode 8 and the p-type layer 5 that has a comparatively high electric resistance. Accordingly, the p-side electrode 8 is preferably formed of an alloy of Ni and Au, or the like, in a thickness of approximately 0.3–0.5 µm. The n-side electrode 9 is formed directly on the n-type layer 3, similarly to the conventional structure. Accordingly, the n-side electrode 9 may be provided by a material formed by Ti/Au layers through a Ti—Al alloy or a Ni—Au alloy.

In the FIG. 3 example, the p-side electrode 8 and the n-side electrode 9 have a given dimension of allowance at a periphery of the chip. This is because, if these electrodes are provided entirely over the surface, the electrode metal possibly suffer breakage during chip breaking resulting in short circuit through a p-n junction with difficulty in recognizing chip boundaries during breaking. Therefore, the electrodes are preferably provided over a broad area to an extent that such problems will not occur. In the present Specification, the electrodes with such a given allowance to chip edges also involve the meaning that they are substantially over the entire chip surface. Meanwhile, the n-side electrode does not have the light emitting layer at an underneath region thereof and the same electrode has not necessarily to be provided over an entire surface therefor. However, the n-side electrode 9 is preferably formed over a wide area in order to prevent against concentration of currents at a part region in the n-type layer 3. Further, the area of the n-side electrode is satisfactory for performing die-bonding so that it is preferred that the area on the n-side electrode is made small so as to increase the area on the side of the p-side electrode provided on the semiconductor layers including the active layer in order to enhance light emitting efficiency with respect to a same size of a chip.

Figure 4:
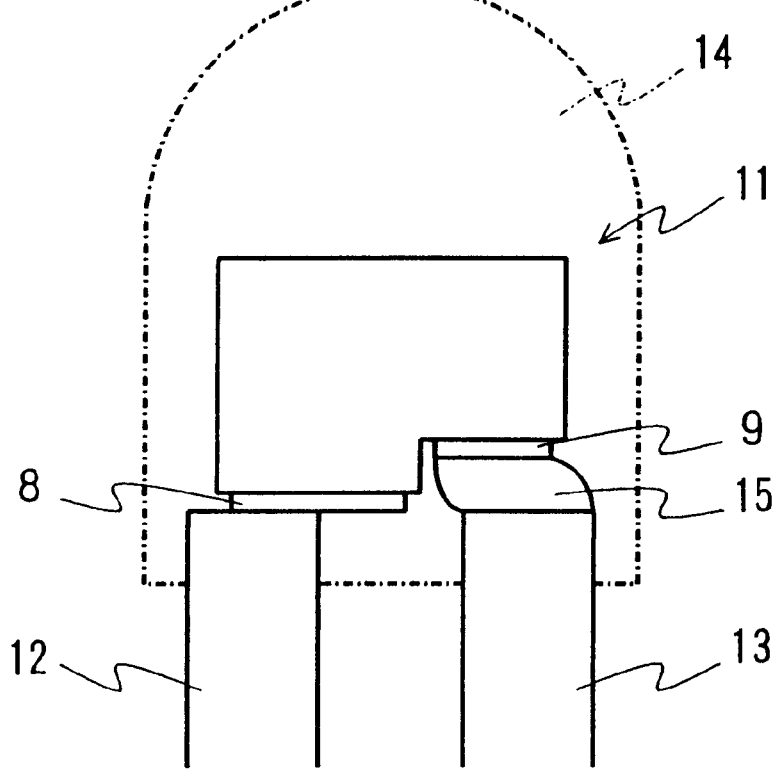
FIG. 4 is an explanatory view of a state that an LED chip of FIG. 3 is bonded on a lead.

An LED chip 11 constructed as above is assembled with its top face down on leads 12, 13, as shown in FIG. 4. The respective electrodes 8, 9 are directly electrically connected onto the leads 12, 13 through a conductive adhesive (the lead 12 side not shown). These elements are encapsulated by a resin package 14, such as an epoxy resin, that is transmissible of light. Otherwise, the LED chip 11 is directly die-bonded on a circuit board or the like. Thus, the LED chip 11 is utilized as a light emitting device for emitting light at the substrate backside and the chip lateral surfaces.

According to the light emitting device of this embodiment, the electrodes are provided over almost the entire surface of the semiconductor layers. Consequently, it is practically impossible to radiate light through the surface on which the electrodes are formed. However, the substrate is formed of a material transmissible of the light emitted by the light emitting layer so that it is possible to utilize also the portions of the light traveling toward the backside of the substrate and the radiated light through the lateral surfaces of the chip. In this case, the light emitted by the light emitting layer travels in every direction wherein the light traveling toward the electrode is reflected by the electrode to the substrate backside. The substrate well transmits the light without substantially absorbing the light. The chip has no obstructions, such as electrodes, to the light so that almost the entire portion of the light traveling toward the substrate backside is allowed to radiate outside the chip. Thus, it is possible to greatly enhance the light emitting efficiency, i.e. the ratio of the light radiated outside to the light emitted.

On the other hand, the p-type layer has the p-side electrode at almost the entire surface thereof so that the respective electrodes have their opposite portions formed, in plan, in parallel with each other, providing uniform distributions of electric currents. Further, the electrodes with low electric resistance can cause an electric current to sufficiently spread, thereby eliminating the necessity of a current diffusion layer for supplying an electric current while transmitting the light. Consequently, there is no necessity of introducing the process for providing a current diffusion layer. Also, there is no reciprocal problem, conventionally encountered, concerning the low resistance of the current diffusion layer and the transmissibility of light. The provision of sufficiently thick electrode for sufficiently reducing the electric resistance enables the electric current to spread to a satisfactory extent. As a result, the electric current spreads throughout the entire portion of the active layer, thereby emitting light with efficiency and hence enhancing the internal light emitting efficiency. When a p-type gallium-nitride based compound semiconductor is employed, it has a comparatively great electric resistance due to insufficient effect by the dopant and the current is difficult to spread. In such a case, however, the provision of electrodes over almost entire surface of the semiconductor layers can spread the electric current broadly. Further, when the LED chip is die-bonded onto a lead, the die-bonding is readily made merely by previously applying a conductive adhesive to a tip of the lead and placing the LED chip upside down thereon for curing. Thus, no wire-bonding is required therefor.

In the FIG. 3 example, the plan shape of the LED chip is not square but rectangular so that the p-side electrode 8 and the n-side electrode 9 are separately placed in a lengthwise direction of the rectangular form. By doing so, the respective electrodes 8, 9 are prevented from short-circuiting therebetween. That is, where these electrodes 8, 9 are provided almost over the entire surface of the semiconductor layers, there are often cases of use that, as sown in FIG. 4, the LED chip 11 at its electrodes 8, 9 is die-bonded faced down on the leads 12, 13 or the like through a conductive adhesive. Meanwhile, the LED chip 11 is very small in size, i.e. its area in plan is usually approximately 0.1 $mm^2$, and accordingly there is a possibility of short circuit occurring between the electrodes 8, 9. However, in the above example, the LED chip 11, in plan, is in a rectangular form so that the respective electrodes are separated in the lengthwise direction, serving to prevent short circuit between the electrodes.

On the other hand, if the chip is formed in a rectangular form, since the light emitting region is constituted by the active layer 4 sandwiched between the n-type layer 3 and the p-type layer 5, the amount of emitted light is secured as long as the its area is secured. In particular, the LED chip of the semiconductor light emitting device according to the present invention utilizes also the light traveling toward the backside of the substrate 1. Accordingly, the electrodes can be provided over the entire surface of the chip to supply electric currents in a manner spreading throughout the chip without taking into consideration the shield of light by the electrodes. Therefore, there is no affection on light emitting characteristics, even if the electrodes are provided extending in a direction away from each other.

In the above embodiment, the semiconductor light emitting device had semiconductor layers formed of a gallium-nitride based compound semiconductor suited for emitting bluish light. In such a bluish-light semiconductor light emitting device, the effects are particularly great, because a sapphire substrate usually used therefor is transmissible of the light emitted by the active layer so that the LED chip can be used upside down, and further the p-type layer is difficult to reduce its electric resistance and accordingly difficult to have ohmic contact with the electrode therefor. However, the face-down die bonding is also available for light emitting devices using a GaP-based or AlGaAs-based semiconductor for emitting green or red light applications, wherein, for example, the AlGaAs-based compound semiconductor having a high Al crystal mixture ratio can transmit a long-wavelength light through a semiconductor substrate used therefor.

The provision of at least the electrode which is above the light emitting layer on almost the entire surface of the semiconductor layers therefor makes unnecessity the formation of a current diffusion layer, eliminating the processes of evaporating and sintering the metals for the current diffusion layer. Moreover, the electric current can be spread throughout the entire surface of the light emitting layer and further the backside surface for radiating light is free of light-obstructing members such as electrodes, enhancing light emitting efficiency. This enables reduction in chip area with respect to a same brightness of a light emitting device. Therefore, the manufacturing process is simplified and the chip yield per one wafer is increased, contributing to reduction of cost.

Figure 5:
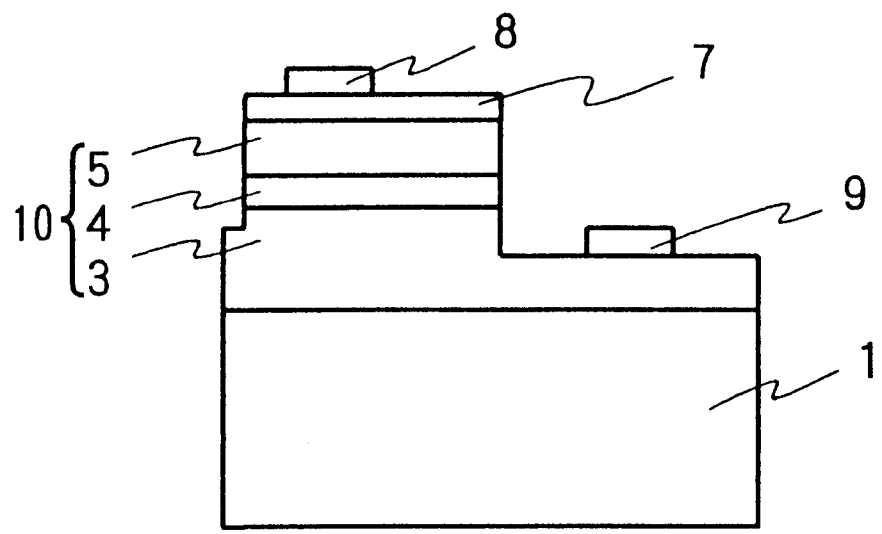
FIGS. 5(a) and 5(b) are explanatory views of a semiconductor light emitting device according to further embodiment of the present invention.
Figure 5:
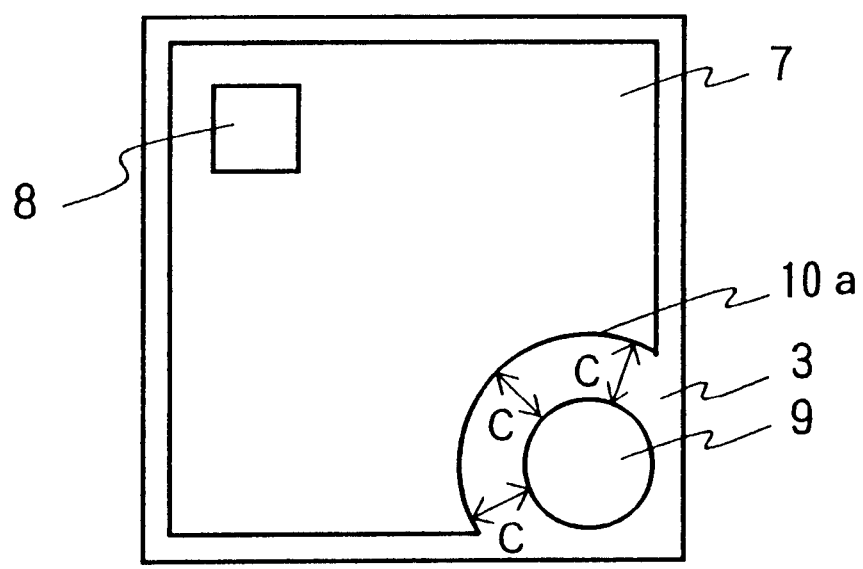

Referring to FIGS. 5(a) and 5(b), there are illustrated a sectional explanatory view and a plan explanatory view of a semiconductor light emitting device according to another embodiment of the present invention. In this embodiment, a current diffusion layer 7 is provided on the surface the semiconductor overlying layers 10 so that the p-side electrode 8 is formed through the current diffusion layer 7. For providing the n-side electrode 9 the semiconductor layers 10 are partly etched away such that an etched end 10a left on the current diffusion layer 7 and the semiconductor layer 10 are in parallel, in a plan form, with the n-side electrode 9 at their opposite portions. As a result, the current diffusion layer has a portion close to the n-side electrode 9 to have an equidistant (C) to the opposite portion of the n-side electrode 9. Incidentally, the methods for shaping the current diffusion layer 7 and the opposite parallel face in the electrode are similar as stated hereinbefore. The structure of the semiconductor layers 10 other than the current diffusion layer is similar to the embodiment of FIGS. 1(a) and 1(b), omitting explanation thereof.

This current diffusion layer 7 can be formed with low electric resistance, though not so low in electric resistance as electrode metals. The uniformity of electric currents is available by forming the current diffusion layer 7 and the n-side electrode 9 in parallel with each other at their opposite portions as shown in FIG. 5(b), in a manner similar to the opposite electrode in parallel form as in the above-stated embodiment. As a result, the current path from the p-side electrode 8 to the n-side electrode 9 has a same electric resistance if taken any route between the n-type layer beneath the etched end 10a and the n-type electrode 9. The resulting LED chip offers uniform light emission at throughout the entire surface. It is therefore possible to freely modify the shape and the position of the p-side electrode 8, as stated later.

Figure 6:
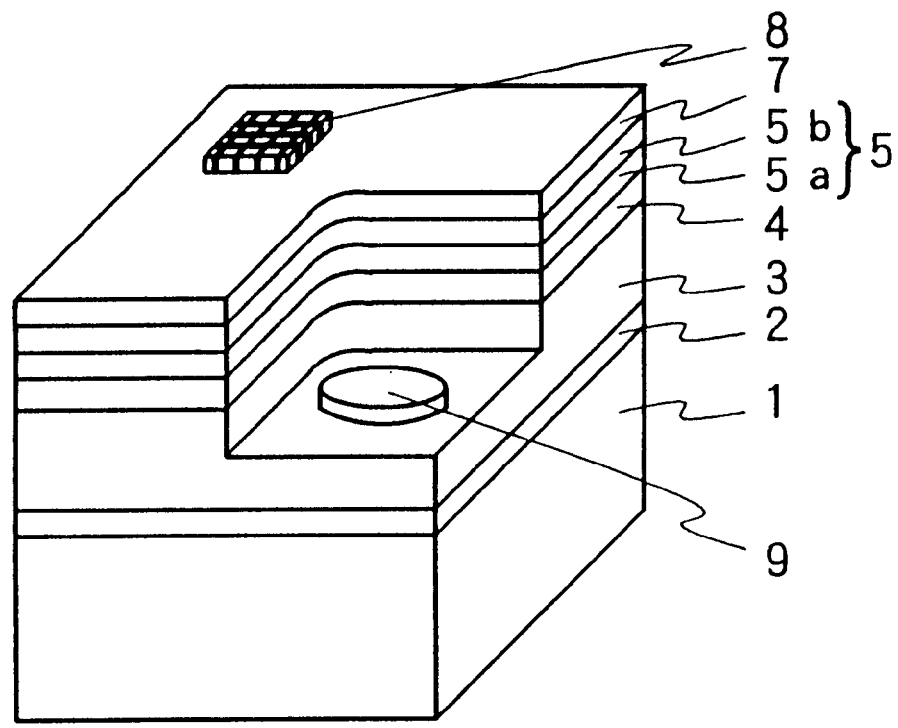
FIGS. 6(a) and 6(b) are explanatory views of a semiconductor light emitting device according to another embodiment of the present invention.
Figure 6:
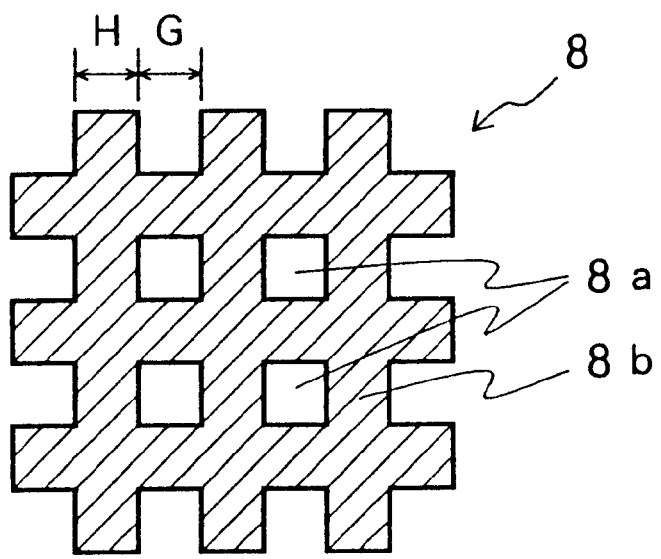

Referring to FIGS. 6(a) and 6(b), there are illustrated views of an embodiment wherein improvement is made over the structure of FIGS. 5(a) and 5(b) in order to reduce the light shield by the electrode so as to further enhance the light emitting efficiency. In this embodiment, the p-side electrode 8 on a light transmission side is formed in a mesh form with voids 8a, for example, as shown in FIG. 6(b), instead of a continuous rectangular form throughout the entire electrode. Other structures are similar to those of FIGS. 5(a) and 5(b), omitting explanations thereof.

This p-side electrode 8 is formed by a Ti/Au layered structure, wherein, for example, the Ti layer is in a thickness of approximately 0.1–0.3 $\mu$m and the Au layer a thickness of approximately 0.3–0.5 $\mu$m. The mesh void 8a has a width G of approximately 10–20 $\mu$m, while the electrode metal 8b has a width H of approximately 10–20 $\mu$m. As a result, the percentage of the electrode metal existing area (the hatched portion in the figure) is approximately 65–75%, while that of the electrode metal non-existing area or void area is approximately 25–35%. The area of the electrode metal 8b requires to such an extent that the adhesion to a metal wire-bonded thereon is sufficient. Accordingly, it is preferred that the electrode metal 8b area is provided in percentage of approximately 65–75% with respect to the bonded area. More preferably, the electrode metal portion 8b is provided in percentage of approximately 75–85% through the voids. The voids 8a dotted between the electrode metal 8b are for transmitting the light emitted through the semiconductor layers, and the area thereof is preferably as large as possible. However, the width G of the void 8a is determined such that sufficient adhesion is given to the electrode metal 8b through wire-bonding.

To provide the p-side electrode 8 in the mesh form, a photoresist layer is formed, for example, on the entire surface of the current diffusion layer 7 and patterned so as to give a mesh pattern to the forming portion of the p-side electrode 8. Thereafter, electrode metals, such as Ti and Au, are vacuum-evaporated and then the photoresist layer is removed so that the electrode metals 8b are adhered only to the portion where the resist layer has been removed. The evaporated metals at the other portions are removed away together with the photoresist layer, thus providing the p-side electrode 8. Alternatively to the lift-off technique that a patterned potoresist layer is formed prior to electrode metal evaporation, the p-side electrode 8 can be provided likewise by evaporating electrode metals over the entire surface and thereafter a photoresist layer is formed and patterned to etch the metals. Incidentally, this form of the electrode has conventionally been formed on a part of the current diffusion layer using the similar patterning with a photoresist film so that it is possible to carry out the process by merely changing the pattern form without increasing any process step.

Figure 7:
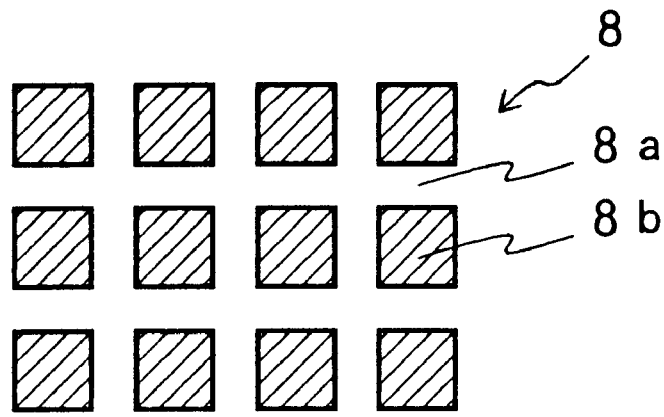
FIGS. 7(a) and 7(b) are explanatory views of a modification to the embodiment of FIG. 6.
Figure 7:
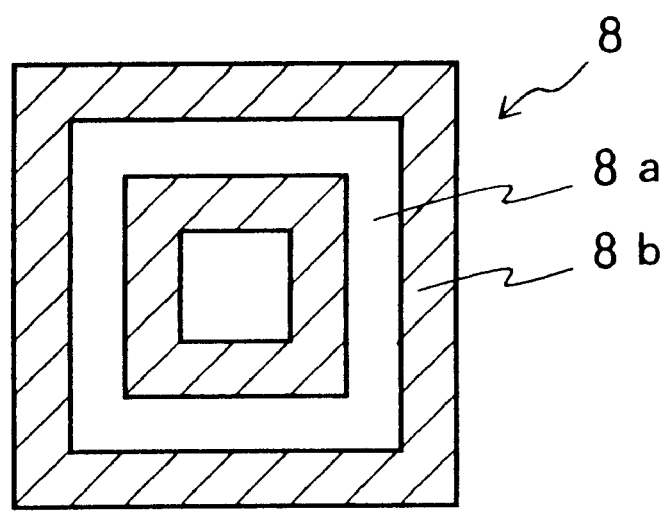

The form of the p-side electrode 8 intermittently provided through the voids 8a is not limited to the mesh form shown in FIG. 6(b), provided that the electrode metal portion 8b and the metal-electrode non-existing void 8a are formed in an alternating manner. For example, the electrode metal 8b may be provided such that the voids 8a are rather in a grating form or in a ring form as shown in FIGS. 7(a) and 7(b). Alternatively, the void or the electrode metal may be other forms such as a polka form. In brief, it is satisfactory that the electrode metal be provided in an intermittent manner to give sufficient adhesion to a metal wire-bonded thereto such that the pattern spacing of the electrode metal is not excessively broad to obtain an appropriate degree of the area of the void for transmitting light therethrough.

According to this embodiment of the semiconductor light emitting device, the opposite surfaces for the current diffusion layer 7 and the n-side electrode 9 are rovided in parallel with each other, wherein, where an electrode is formed in a light emitting surface for emitting therethrough the light, the same electrode is formed in such an intermittent manner as a mesh form, a grid or lattice form, or a ring form. To this end, the chip has an uniform concentration of electric current flow to thereby offer uniform light emission with efficiency, while radiating the light through the voids in the electrode metal where wire-bonding is not made thereon enhancing the light emitting efficiency. In this case, sufficient adhesion to the wire-bonding metal is obtained by a bridge formed electrode metal. As a result, the light radiation is also possible through the electrode portions where wire-bonding is not made, though the light has conventionally been shielded by the electrode that had to be formed larger in area than the wire-bonded portion of the electrode. This contributes to the increase of brightness.

In this embodiment, since light emission can be made through also the electrode provided on the light radiating side, the electric current is sufficiently diffused to thereby enhance the light emitting efficiency by placing the electrode on an wide area of the current diffusion layer where conventionally the electric current could not be fully diffused due to high resistance.

In the above embodiment, the mesh form or the like was given only to the p-side electrode. However, where p-side and n-side electrodes are both provided on the light radiating side as shown in FIG. 6(a), it is possible to further increase the light emitting efficiency by forming also the n-side electrode in the similar structure to the p-side electrode. Although in the embodiment of FIG. 6(a) the effect is not so significant as the p-side electrode because no light emitting layer exists beneath the n-side electrode, the light reflected by the backside of the substrate can also radiate through the n-side electrode side, providing a similar effect.

Further, although in the above embodiment the electrode provided intermittently through the voids was in a rectangular form, the shape of the electrode is not limited but can be formed in another form such as circular.

In the FIG. 6(a) example, the semiconductor layers were patterned such that the electrode diffusion layer 7 and the n-side electrode 9 are in parallel in plan with each other at their opposite portions. Such a structure is preferred because of uniform distribution of electric current flow. However, the shape of the electrode on the light radiating side, if formed in a structure with voids, can enhance the light emitting efficiency regardless of the shape of the current diffusion layer. With this structure, it is possible for a semiconductor light emitting device having an electrode on its light radiating side to enhance the light emitting efficiency for the light that can be radiated outside the light radiating surface. To this end, it is possible to enhance the light emitting efficiency for a semiconductor light emitting device utilizing a gallium-nitride based compound semiconductor that is low in light emitting efficiency, to provide higher brightness with respect to the same-size of a chip. Also, it is possible to reduce the chip size in obtaining the same brightness of a semiconductor light emitting device, thus increasing the chip yield from one wafer and hence contributing cost reduction.

Figure 8:
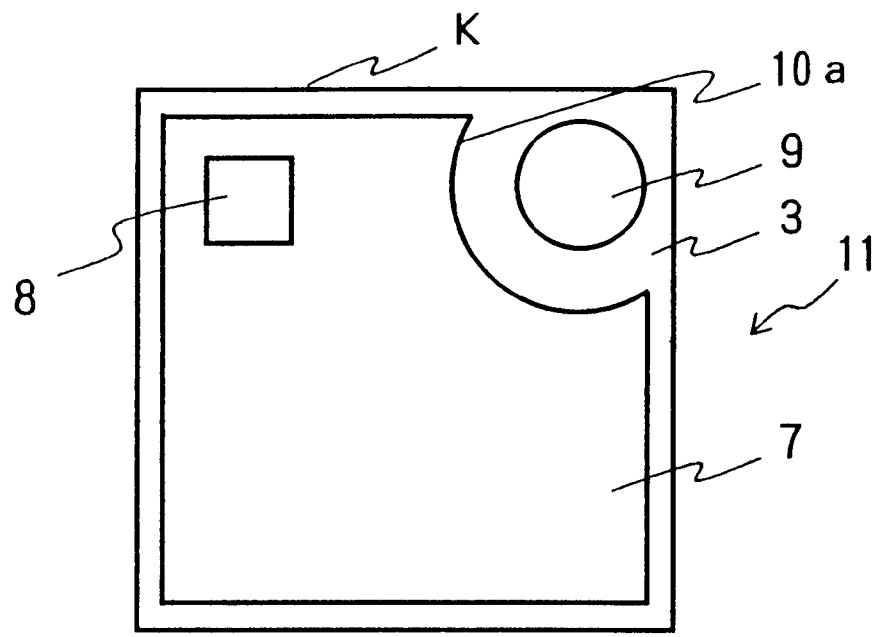
FIG. 8 is a plan explanatory view of a semiconductor light emitting device according to another embodiment of the present invention.

Referring to FIG. 8, there is illustrated a structure having an n-side electrode 9 and a p-side electrode 8 which are arranged in parallel to one side of an LED chip. That is, with this structure it is possible to readily and positively die-bond the LED chip onto a circuit board of a glass-epoxy or the like by inputting, without failure, the x-coordinate and the y-coordinate into an automatic machine to perform automatic wire-bonding. Other structures are similar to the structure of FIGS. 5(a) and 5(b), omitting explanations thereof.

That is, this embodiment has the p-side electrode 8 and the n-side electrode 9 that are placed along one side K of the LED chip 11 is rectangular in plan. Consequently, the direction, in which the p-side electrode 8 and the n-side electrode 9 are connected to each other, is in parallel with the one side K of the LED chip 11 so that the both electrodes are positioned at a given distance with reference to the same side. Even if the both electrodes 8, 9 are provided deviated on the LED chip 11, the electric current is diffused over the entire surface of the LED chip due to the current diffusion layer 7. The electric current is brought into even distribution to give uniform light emission because of the presence, in plan, of the parallel portions in the current diffusion layer 7 and the n-side electrode 9.

To form an LED chip in such a form, semiconductor layers are formed on a sapphire substrate 1. After forming the semiconductor layers 10 and a current diffusion layer 7 thereon, part of the semiconductor layers 10, i.e. at one corner of the rectangular-shaped chip, are etched away to expose an n-type layer 3 in order to provide an n-side electrode. An n-side electrode 9 is formed on the exposed n-type layer 3 and a p-side electrode 8 is formed at a corner portion adjacent to the corner portion having the n-side electrode 9 provided thereon.

Figure 9:
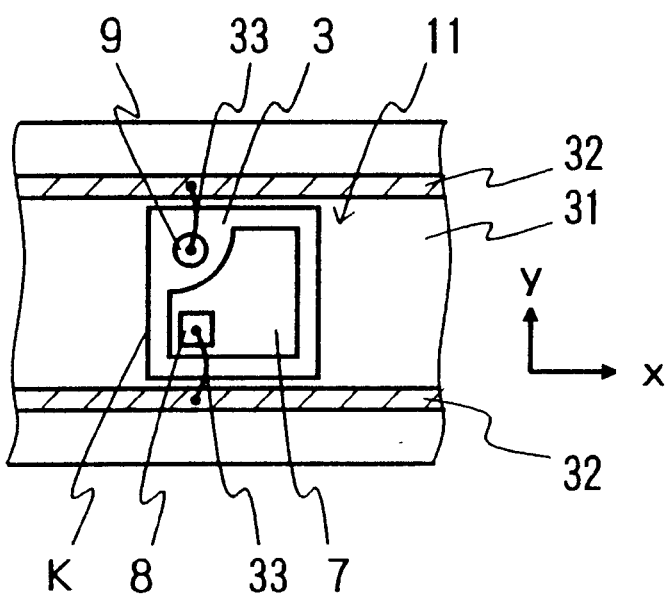
FIG. 9 is an explanatory view of wire-bonding wherein an LED chip of FIG. 8 is mounted on a circuit board.
Figure 10:
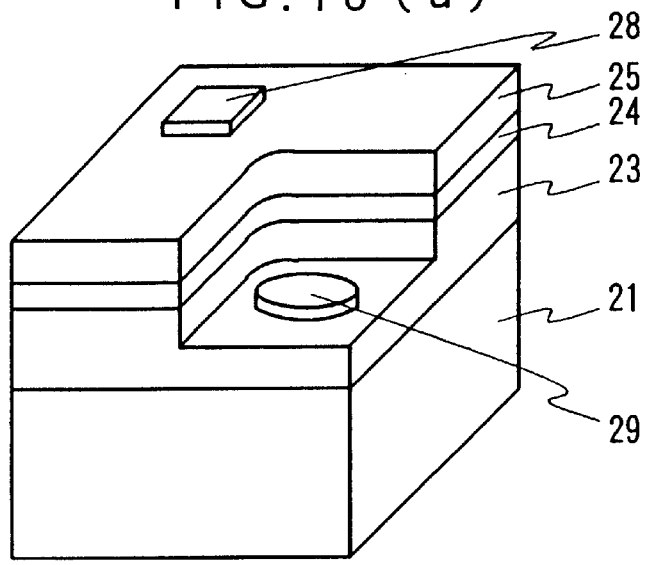
FIGS. 10(a) to 10(c) are explanatory views of a conventional blue-light LED chip.
Figure 10:
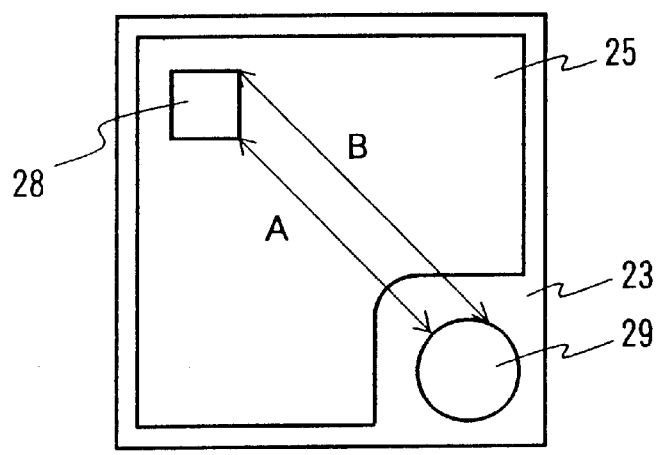
Figure 10:
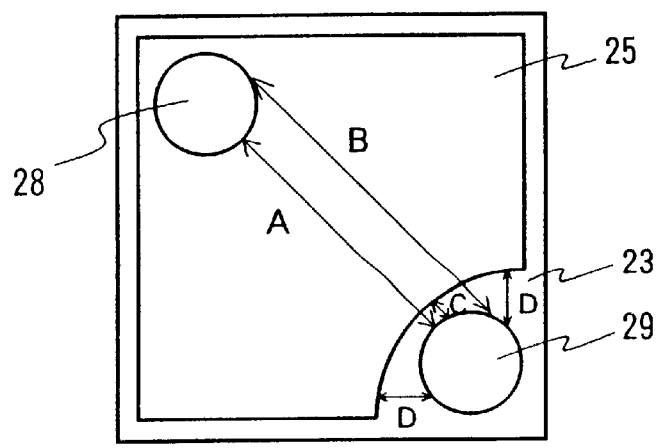

In this embodiment, the n-side electrode 9 and the p-side electrode 8 are arranged almost in parallel with the one side K of the LED chip 11. Consequently, when the LED chip 11 is mounted on between interconnections 32 on a circuit board 31, it is possible to easily and positively perform wire-bonding by mounting the chip with the one side K positioned in parallel with these interconnections 32. That is, as sown in FIG. 9 the respective electrodes 8, 9 have a same x-coordinate provided that the direction, in which the interconnection 32 is provided, is considered as an x-direction. Accordingly, when inputting the coordinates for bonding positions into an automatic machine to carry out automatic wire-bonding, it is satisfactory to input only the y-coordinate. This greatly reduces the amount of input data, so that the positions of the x-side electrode and the y-side electrode are prevented from erroneously inputted. During wire-bonding, the bonding machine require movement only in the y-direction to perform wire-bonding to the respective electrodes with gold wires, without moving in the x-direction. Thus, wire-bonding is done in a brief time without inefficient movements.

Meanwhile, the supply of electric current is in a direction from the p-side electrode 8 to the n-side electrode 9, the electric current in general cases is difficult to flow at regions close to a side opposite to the side along which the electrodes are provided. However, the provision of the current diffusion layer 7 on the surface of the p-type layer 5, as stated before, reduces electric resistance to sufficiently diffuse the electric current through the current diffusion layer 7. As a result, the electric current is spread throughout the p-type layer 5 to flow into the underlying n-type layer 3. The electric current reaching the n-type layer 3 flows toward the n-side electrode 9. In this case, since an etched end 10a in the p-type layer 5 and the n-side electrode 9 are formed at their opposite portions in parallel in plan with each other, the distance and hence the series resistance between the n-type layer 3 immediately beneath the etched end 10a and the n-side electrode 9 becomes the same at every position. There is no possibility that the electric-current path deviates at a small resistance points between the p-type layer 5 and the n-type layer 3. This offers for uniform light emission.

In this embodiment, the pair of the electrodes are placed in a direction in parallel with one side of an LED chip so that, when the chip is die-bonded onto a circuit board to be wire-bonded thereto, the coordinate setting to an automatic machine may be only for one coordinate direction, thus facilitating the operation. Therefore, the shape of the LED chip may be a form other than rectangular, i.e. a triangular form. The shape of the electrodes (pads) is not limited to the form of FIG. 8, but may be formed in other forms, i.e. circular or rectangular. If at least one of the electrodes is provided broad in width, it is possible to wire-bond to respective electrodes by setting only the y-coordinate with the x-value given constant as stated before, provided that the same electrode having as a part thereof a width for wire-bonding is formed, together with the other electrode, on one side of the chip.

In the FIG. 8 example, the semiconductor layers were patterned such that the current diffusion layer 7 and the n-side electrode 9 are in parallel in plan with each other at their opposite portions. Such a structure is preferred because of uniform distribution of electric current flow. In particular, that structure is preferred regardless of the shape of the current diffusion layer, where the LED chip is automatically die-bonded onto a circuit board having interconnection patterns on respective sides. Since the pair of the electrodes are provided in a direction in parallel with the one side of the LED chip, it is satisfactory to setting the bonding position only in one direction when the chip is die-bonded onto a circuit board to perform wire-bonding, reducing erroneous inputting. This enables the movement for an automatic machine only in one direction, eliminating inefficient movements. The assembling is made with high efficiency and high yield.

The above embodiments were on the doublehetero structure having the active layer 4 sandwiched between the n-type layer 3 and the p-type layer 5. However, the present invention is also applicable to a p-n junction structure wherein an n-type layer and a p-type layer are directly connected with each other. The materials for the semiconductor layers were merely as examples and not limited to the afore-said ones. In particular, the gallium-nitride based compound semiconductor offers for great effects because it is high in electric resistance.

Meanwhile, the above embodiments were explained on the semiconductor light emitting devices for emitting bluish light that use a gallium-nitride based compound semiconductor in the semiconductor layers. The bluish light semiconductor light emitting device thus using a gallium-nitride based compound semiconductor is high in semiconductor-layer electric resistance. Consequently, the electrode made as large as possible contributes to electric current diffusion. The effects are great for such devices, because the bluish-light device is lower in light emitting efficiency than the red-light semiconductor light emitting device and accordingly there is a demand for increasing the light emitting efficiency. For light emitting devices for emitting red or green light using a GaAs-based or GaP-based semiconductor, if an electrode on a light radiating surface side is made in a mesh form or the like, the light emitting efficiency thereof can be enhanced.

According to the present invention, the electric current distribution is uniform within the light emitting chip to thereby provide uniform light emission and hence increase light emitting efficiency. Moreover, there is no concentration of currents at particular regions. Therefore, there is no fear that the semiconductor layers are deteriorated at certain regions to shorten service life or results in failure. Thus, the semiconductor light emitting device is high in characteristics and reliability even where it is formed by a gallium-nitride based compound semiconductor that is susceptible to lowering in light emitting efficiency and shortening in life.

Although preferred embodiments have been described in some detail, it is to be understood that certain changes can be made by those skilled in the art without departing from the spirit and scope of the invention as defined by the appended claims.

What is claimed is:

1. A semiconductor light emitting device comprising:
   a substrate in a quadrilateral form;
   semiconductor layers formed, of a gallium-nitride based compound semiconductor, on said substrate to include a first conductivity type semiconductor layer and a second conductivity type semiconductor layer;
   a first electrode formed in electrical connection with said first conductivity type semiconductor layer provided on a surface side of said semiconductor layers;
   a second electrode formed in electrical connection with said second conductivity type semiconductor layer exposed by partly etch-removing an end portion in plan of said semiconductor layers; and
   wherein said first and second electrodes are formed such that said electrodes are in parallel, in plan form, with each other at opposite portions thereof wherein said electrodes are light shields; and wherein said semiconductor light emitting device further comprises a current diffusion layer provided on said semiconductor layers at the surface side of said semiconductor layers.

2. A semiconductor light emitting device according to claim 1, wherein an end form of said first conductivity type semiconductor layer which is left unetched in the etching and said second electrode are formed in parallel, in plan form, with each other at opposite portions thereof.

3. A semiconductor light emitting device according to claim 1, wherein at least said first electrode is formed at substantially an entire surface of said semiconductor layer thereof on which said electrode is provided.

4. A semiconductor light emitting device comprising:
   a substrate in a quadrilateral form;
   semiconductor layers formed, of a gallium-nitride based compound semiconductor, on said substrate to include a first conductivity type semiconductor layer and a second conductivity type semiconductor layer;
   a first electrode formed in electrical connection with said first conductivity type semiconductor layer provided on a surface side of said semiconductor layers;
   a second electrode formed in electrical connection with said second conductivity type semiconductor layer exposed by partly etch-removing an end portion in plan of said semiconductor layers;
   wherein said first and second electrodes are formed such that said electrodes are in parallel, in plan form, with each other at opposite portions thereof wherein said electrodes are light shields;
   wherein at least said first electrode is formed at substantially an entire surface of said semiconductor layer thereof on which said electrode is provided; and
   wherein said substrate is formed in a rectangular form in plan, and said first and second electrodes being separately provided in a lengthwise direction of said rectangular form.

5. A semiconductor light emitting device comprising:
   a substrate in a quadrilateral form;
   semiconductor layers formed, of a gallium-nitride based compound semiconductor, on said substrate to include a first conductivity type semiconductor layer and a second conductivity type semiconductor layer;
   a first electrode formed in electrical connection with said first conductivity type semiconductor layer provided on a surface side of said semiconductor layers;
   a second electrode formed in electrical connection with said second conductivity type semiconductor layer exposed by partly etch-removing an end portion in plan of said semiconductor layers;
   wherein said first and second electrodes are formed such that said electrodes are in parallel, in plan form, with each other at opposite portions thereof wherein said electrodes are light shields; and
   wherein said substrate is formed in a rectangular form in plan, and said first and second electrodes being separately provided in a lengthwise direction of said rectangular form.

6. A semiconductor light emitting device according to claim 1, wherein said substrate is a sapphire substrate, and said semiconductor layers being of a gallium-nitride based compound semiconductor.

7. A semiconductor light emitting device comprising:
   a substrate in a quadrilateral form;
   semiconductor layers formed of a gallium-nitride based compound semiconductor on said substrate to include a first conductivity type semiconductor layer and a second conductivity type semiconductor layer;

a current diffusion layer provided in said semiconductor layer on a surface side thereof;

a first electrode formed on a surface of said current diffusion layer to have electrical connection with said first conductivity type semiconductor layer;

a second electrode formed in electrical connection with said second conductivity type semiconductor layer exposed by partly etch-removing an end portion in plan of said semiconductor layers; and wherein said current diffusion layer left unetched in the etching and said second electrode are formed to have an equi-distance given therebetween, in plan form, at opposite portions thereof, and at least said first electrode of said electrodes having voids formed therethrogh.

8. A semiconductor light emitting device comprising:

a substrate in a quadrilateral form;

semiconductor layers formed of a gallium-nitride based compound semiconductor on said substrate to include a first conductivity type layer and a second conductivity type layer;

a current diffusion layer provided in said semiconductor layer on a surface side thereof;

a first electrode formed on a surface of said current diffusion layer to have electrical connection with said first conductivity type semiconductor layer;

a second electrode formed in electrical connection with said second conductivity type semiconductor layer exposed by partly etch-removing an end portion in plan of said semiconductor layers; and wherein said current diffusion layer left unetched in the etching and said second electrode are formed to have an equi-distance given therebetween, in plan form, at opposite portions thereof, and both said first and second electrodes being formed along one side in plan form of said substrate.

9. A semiconductor light emitting device comprising:

a substrate;

semiconductor layers formed on said substrate to include a first conductivity type semiconductor layer and a second conductivity type semiconductor layer;

a first electrode formed in electrical connection with said first conductivity type semiconductor layer of said semiconductor layers;

a second electrode formed in electrical connection with said second conductivity type semiconductor layer of said semiconductor layers; and wherein said first electrode has voids formed therethrough so that light is radiated through a surface on which sad first electrode is provided.

10. A semiconductor light emitting device comprising:

a substrate in a quadrilateral form;

semiconductor layers formed of a gallium-nitride based compound semiconductor on said substrate;

a first electrode formed in electrical connection with said first conductivity type semiconductor layer in said semiconductor layers on a surface side thereof;

a second electrode formed in electrical connection with said second conductivity type semiconductor layer exposed by partly etch-removing an end portion in plan of said semiconductor layers; and wherein both said first and second electrodes are provided along one side in plan form of said substrate.

* * * * *